United States Patent [19]
Churcher

[11] Patent Number: 5,657,290
[45] Date of Patent: Aug. 12, 1997

[54] SENSE AMPLIFIER FOR READING LOGIC DEVICES

[75] Inventor: Stephen Churcher, Edinburgh, Scotland

[73] Assignee: Xilinx, Inc., San Jose, Calif.

[21] Appl. No.: 746,179

[22] Filed: Nov. 5, 1996

Related U.S. Application Data

[63] Continuation of Ser. No. 460,314, Jun. 2, 1995, abandoned.

[30] Foreign Application Priority Data

May 11, 1995 [GB] United Kingdom .................. 9509817

[51] Int. Cl.$^6$ .................................................. G11C 7/06
[52] U.S. Cl. .................... 365/205; 365/156; 365/189.29; 365/189.11
[58] Field of Search ................................ 365/803, 205, 365/156, 189.09, 189.11

[56] References Cited

PUBLICATIONS

West, N. and Eshraghian, K. "Principles of CMOS VLSI Design—A Systems Perspective", Addison–Wesley, 1985, pp. 362–364.

Glasser, L.A., Dobberpuhl, D.W., "The Design and Analysis of VLSI Circuits", Addison–Wesley, 1985, pp. 283–291.

Prince, B., "Semiconductor Memories—A Handbook of Design, Manufacture, and Application", Wiley, 1991, pp. 164–165, pp. 172–174, pp. 255–259, pp. 281–285, and pp. 418–420.

Textbook, "Analogue IC Design: The Current Mode Approach", Peter Peregrinus Ltd. (London), ISBN 086341 2157, Chapter 12, pp. 451–489, Toumazou et al. Editors.

*Primary Examiner*—Joseph E. Clawson, Jr.
*Attorney, Agent, or Firm*—Edel M. Young

[57] ABSTRACT

A sense amplifier is provided which is appropriate for reading memory cells which control N-channel transistors, and which can read single ended registers. The sense amplifier pulls bit and bitbar lines to a high voltage before reading, and interprets equal voltages on two legs as a logical 1. Several embodiments are illustrated, one of which latches the value read from a memory cell, and one of which includes two stages.

10 Claims, 4 Drawing Sheets

SENSE AMPLIFIER FOR READING LOGIC DEVICES

This application is a continuation of application Ser. No. 08/460,314, filed Jun. 2, 1995 abandoned.

FIELD OF INVENTION

The invention relates to integrated circuits and particularly to programmable integrated circuits having a memory for holding configuration information and registers for holding user logic values.

BACKGROUND

Sense amplifiers for reading bit lines and bitbar lines from memory cells are well known. Typically these devices precharge bit and bitbar lines to an intermediate value, for example 2.5 volts in a 5 volt system, then read the differential voltage between the bit and bitbar lines when a word line is turned on to connect the memory cell to the bit and bitbar lines. For example, sense amplifiers are described by Weste, N., Eshraghian, K, "Principles of CMOS VLSI Design—A Systems Perspective", Addison-Wesley, 1985, pp 362–364. Other descriptions appear in Glasser, L. A., Dobberpuhl, D. W., "The Design and Analysis of VLSI Circuits", Addison-Wesley, 1985, pp. 283–291; and in Prince, B., "Semiconductor Memories —A Handbook of Design, Manufacture, and Application", Wiley, 1991, pp. 164–165, pp 172–174, pp 255–259, pp. 281–285, and pp 418–420.

In a programmable device which uses the voltage from a memory cell to control a pass transistor, it is important that the act of reading the value in the memory cell not disturb the voltage which controls the pass transistor. Conventional sense amplifiers allow too great a disturbance in the memory cell voltages to be of any value.

Thus it is desirable to provide a sense amplifier which can read a memory cell value without significantly disturbing the memory cell.

In a textbook "Analogue IC Design: The Current Mode Approach" published in 1990 by Peter Peregrinus Ltd. (London) ISBN 086341 2157, at Chapter 12, pages 451–489, author E. Seevinck discusses "Analog Interface Circuits for VLSI". A circuit presented by Seevinck is shown here in FIG. 1. This circuit uses a preamplifier 10 to read a current differential between bit line B and bitbar line $\overline{B}$. The current differential is converted to a voltage logic level in a second stage 11. Preamplifier 10 comprises four equally sized PMOS transistors in a cross-coupled configuration. Preamplifier 10 is selected by grounding the select line SEL. Current then flows through bitline loads L1 and L2. The drains of transistors M13 and M14 are connected to data lines D and $\overline{D}$, which are pulled close to ground level by transistors T11 and T12. Thus transistors M13 and M14 are fully on.

When memory cell CELL is accessed, current flows either from left to right or from right to left depending upon the value in CELL. The gate/source voltage $V_{GS}$ of transistor M11 will be equal to that of M13 since their currents are equal and both are in saturation. The same is true of transistors M12 and M14. The differential current between B and $\overline{B}$ is transferred to D and $\overline{D}$, and is amplified and converted to a logic level by second stage 11. Transistors T11 and T12 turn on by different amounts and turn on transistors M51 and M52 by different amounts, in turn producing an amplified voltage difference at node N1 representing $\overline{D}$—D, which is then inverted by transistors T13 and T14 to product a signal OUT reflecting the value on bit line B from memory cell CELL.

The circuit of FIG. 1 requires both bit and bitbar signals in order to properly derive a signal OUT which represents the value in CELL. It is sometimes desirable to reliably read a register which holds a user logic value and provides only a single output value connectable to a bit line but no complement connectable to a bitbar line. The circuit of FIG. 1 can not accomplish this goal.

It is further desirable to have a sense amplifier circuit which can latch a value from a memory cell to ease timing constraints on other parts of an integrated circuit of which the memory cell is a part.

SUMMARY OF THE INVENTION

The sense amplifier of the present invention can read a memory cell value without significantly disturbing the memory cell, and in particular allows N-channel transistors to remain fully on when the memory cell is being read. If a memory cell state is used to control an N-channel transistor, voltage to the gate of the N-channel transistor remains near 5 volts and the N-channel transistor remains fully on while the memory cell is being read by the sense amplifier.

In one embodiment, the sense amplifier can latch the sensed value. In another embodiment, a two-stage sense amplifier is provided comprising a current-sensing front end and a differential voltage comparator. The sense amplifier requires minimum power dissipation and in one embodiment is able to sense a value in less than 10 ns. The sense amplifier of the invention is usable with many different integrated circuit devices.

The sense amplifier of the present invention holds bit and bitbar lines at near 5 volts (in a 5 volt system) when a read is not occurring and reads a differential current when a word line is activated. No precharge before reading is required.

In some embodiments, the sense amplifier also can reliably read a register which provides only a single Q output value.

DETAILED DESCRIPTION OF THE DRAWINGS.

Figure 1:
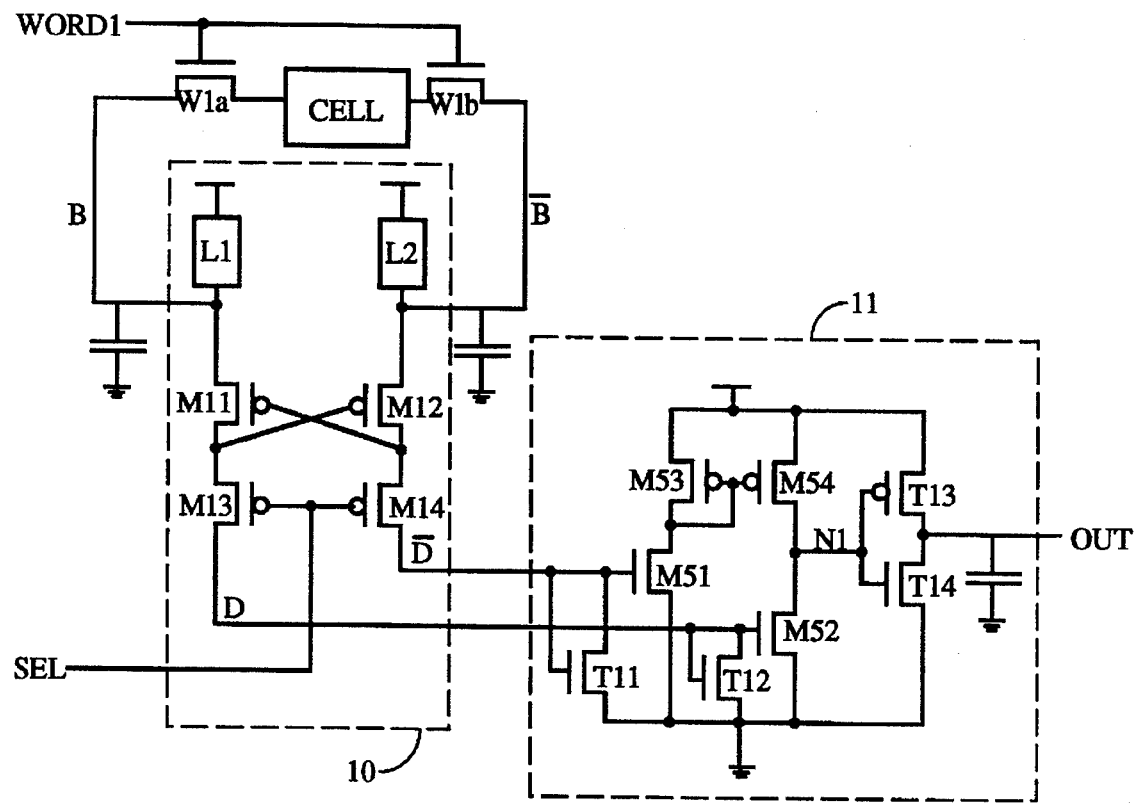
FIG. 1 shows a prior art sense amplifier presented by Seevinck, ibid.
Figure 2:
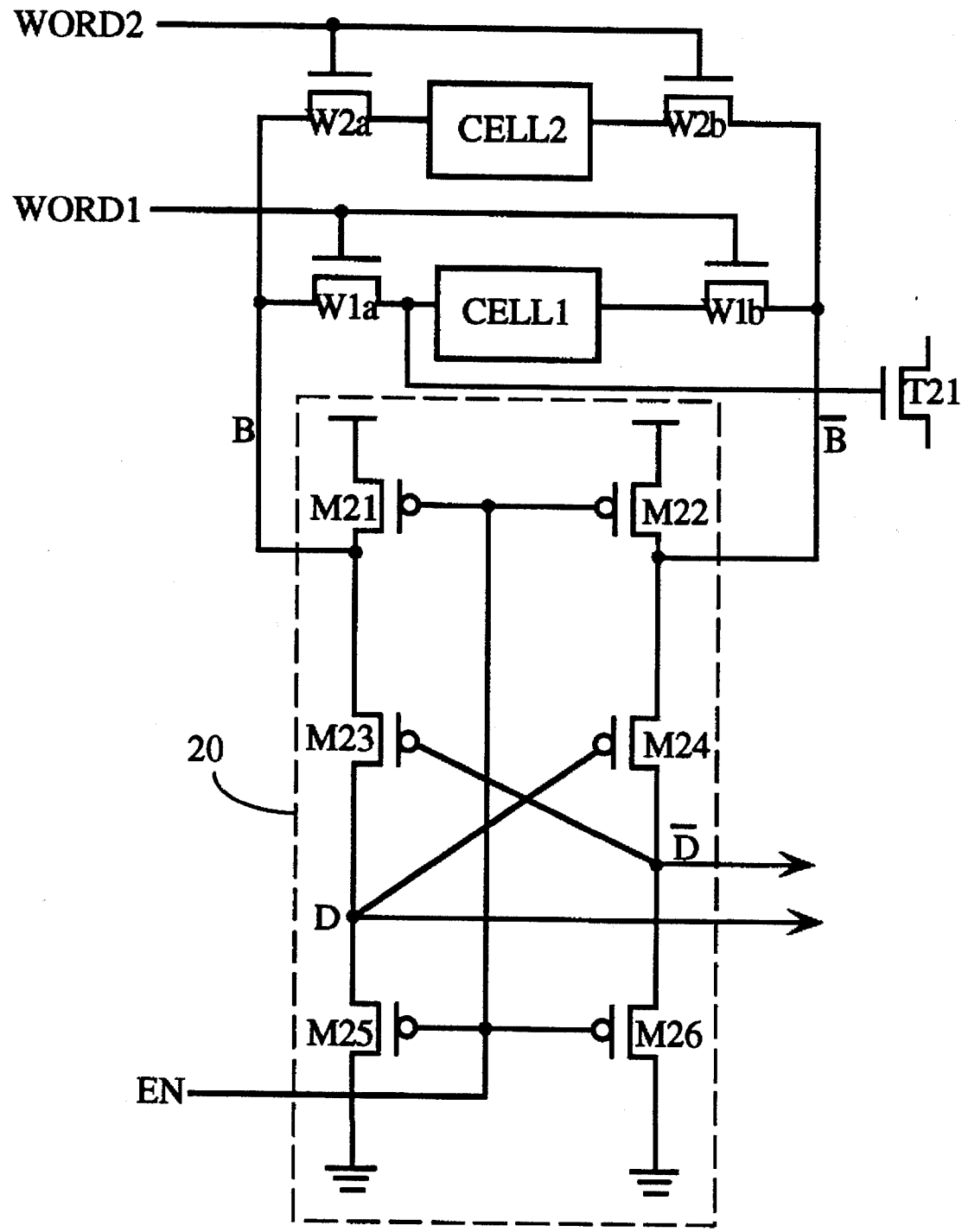
FIG. 2 shows the preamplifier stage of a first embodiment of the sense amplifier of the present invention.

FIG. 2 shows one sense amplifier first stage 20 according to the invention. This sense amplifier first stage comprises two pull-up transistors M21 and M22, two pull-down transistors M25 and M26, and a matched pair of cross-coupled transistors M23 and M24, which provide positive feedback. The circuit operates as follows:

1. To read a memory cell CELL1, EN is taken low, activating amplifier first stage 20. Transistors M21 and M22 turn on, pulling both B and $\overline{B}$ to near Vdd, thereby equalizing the two bitline potentials.
2. Word line WORD1 is pulled high. Assuming CELL1 holds a 1, CELL1 will attempt to source current onto B and sink current from $\overline{B}$. (If CELL1 holds a 0 the current is in the opposite direction.)

3. The slightly higher voltage on B causes a higher current through M23 than through M24 and a slightly higher voltage at D than at $\overline{D}$.

4. The cross coupling of M23 and M24 reinforces the voltage difference between D and $\overline{D}$.

5. This higher voltage at D causes M25 to be more conductive than M26, which reduces the voltage difference D and $\overline{D}$ and prevents latching. In one embodiment, the voltage difference between D and $\overline{D}$ is on the order of 0.5 volts.

6. The voltage difference between D and $\overline{D}$ is amplified by a second stage (not shown in FIG. 2) to generate an output signal representative of the value in cell CELL1.

Several advantages are provided by the structure of FIG. 2. Transistors such as T21 which are controlled by memory cell CELL1 remain fully on while CELL1 is being read because bitline B does not pull down the Q output of CELL1. If CELL1 held a logic 0 and thus held transistor T21 off, turning on W1a when WORD1 goes high pulls the logic 0 Q value toward the 5 volt B value. Preferably the sizes of inverters in memory cells such as CELL1 and the sizes of transistors such as W1a are selected so that when word line W1a is on and CELL1 holds a logic 0, the voltage stabilizes at about 1.0 volts, which is sufficiently close to the threshold voltage of a typical CMOS N-channel transistor T21 to maintain N-channel transistor T21 off or nearly off, and thus not disturb the logic states of structures which connect to transistor T21 while CELL1 is being read.

As a further novel feature of the invention, if it is necessary to further assure that reading a cell not disturb either the contents of the cell or any transistors which are being controlled by the cell, the cell can be partially isolated from the bit line (and bitbar line if present) by reading with a word line voltage less than Vdd. If the maximum word line voltage is 3.5 volts, the voltage on transistor T21 for a logic 0 memory cell will not rise to more than about 0.4 volts, which is well below the threshold voltage for transistor T21. Of course, for a logic 1 memory cell, the voltage at T21 remains at 5 volts during a read, and thus a read of CELL1 causes no disturbance to T21.

Figure 3:
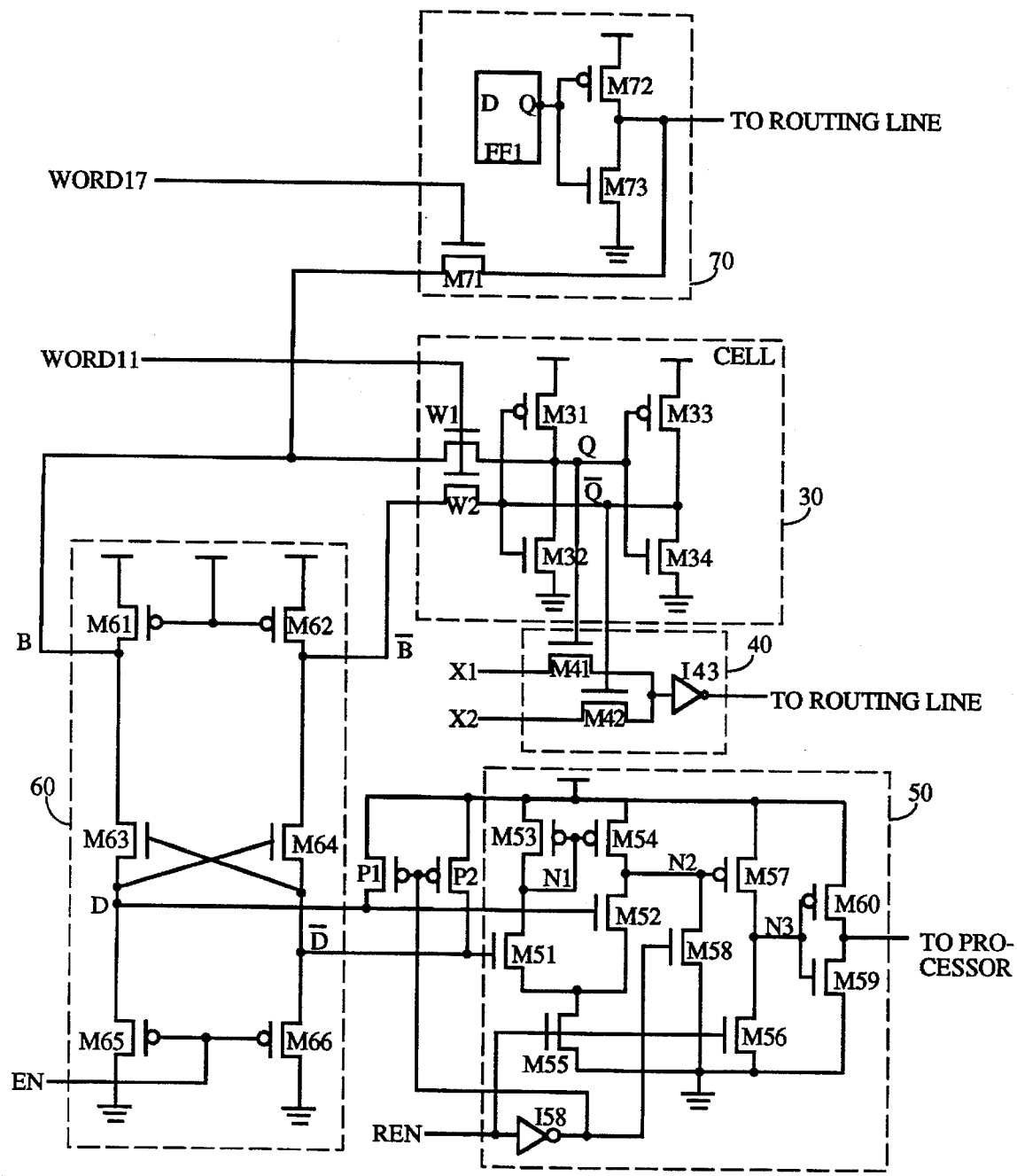
FIG. 3 shows a second embodiment of the sense amplifier of the present invention including a novel amplifier stage, and shows the relationship of the sense amplifier to a memory cell and a register in an FPGA.

FIG. 3 shows yet another preamplifier 60 according to the invention, and a novel amplifier stage 50. Preamplifier 60 is similar to preamplifier 20 of FIG. 2, but includes load transistors M61 and M62 which are permanently enabled. Amplifier 50 of FIG. 3 is able to read a single-ended register 70 which is read on bit line B but applies no signal to bitbar line $\overline{B}$.

In FIG. 3, bit line B and bitbar line $\overline{B}$ are both driven by memory cell 30, as was discussed above. However, only bit line B is driven by register 70. To read register 70, preamplifier 60 will produce a differential voltage between D and $\overline{D}$ when register 70 is providing a logical 0 to its routing line because B will be pulled down slightly by register 70. However, when register 70 carries a logical 1, both B and $\overline{B}$ are at 5 volts, and no differential will be detected. According to the invention, transistors in amplifier 50 are sized so that equal voltages on D and $\overline{D}$ are read as a logical 1. In one embodiment the width-to-length ratios in amplifier 50 are as follows:

| Transistor | Width/Length |
|---|---|
| M51 | 14.4/0.8 |
| M52 | 14.4/0.8 |
| M53 | 2.4/0.9 |
| M54 | 2.4/0.9 |
| M55 | 2.4/8.4 |
| M56 | 2.4/5.6 |
| M57 | 8.4/0.9 |
| M58 | 2.4/0.8 |
| M59 | 2.4/4.8 |
| M60 | 4.8/0.9 |

Amplifier 50 operates as follows:

1. Circuit 50 is enabled by bringing the read enable signal REN high. This turns on transistors M55 and M56, and turns off transistor M58. This also turns off pull-up transistors P1 and P2.

2. If D is higher than $\overline{D}$, transistor M52 will be more conductive than transistor M51. The lower conductivity on M51 tends to raise the voltage at node N1, which makes transistor M54 less conductive. The lower conductivity of M54 and higher conductivity of M52 lower the voltage at N2. This turns on transistor M57. Weak transistor M56 is overcome by transistor M57, and thus pulls up node N3. The high voltage at N3 turns off M60 and turns on M59, thus bringing the output voltage TO PROCESSOR to a logical 0.

3. If D is lower than $\overline{D}$, node N1 goes lower, transistor M54 is more conductive and M52 is less conductive so node N2 goes higher. This turns off M57 so N3 goes low thus bringing the output voltage TO PROCESSOR to a logical 1.

4. If D is equal to $\overline{D}$, the situation which occurs when the circuit is reading a logical 1 from register 70, node N2 is at an intermediate voltage, turning transistor M57 partly on. Since transistor M57 is stronger than M56 (M57 has a higher width to length ratio than M56), transistor M57 pulls up node N3 which causes the output signal to register a logical 0.

5. Circuit 50 is disabled by bringing REN low. This turns on pullup transistors P1 and P2, which pulls D and $\overline{D}$ to Vdd quickly and assures that there will be no voltage differential remaining between D and $\overline{D}$ when the next read takes place. Of course the sense of the output signal could follow either D or $\overline{D}$, depending upon how many inversions the signal encounters. The circuit of FIG. 3 provides the same output signal when D is higher than $\overline{D}$ as when D is equal to $\overline{D}$, and thus provides the correct value for a single ended register 70 as well as for a double ended memory cell 30.

Figure 4:
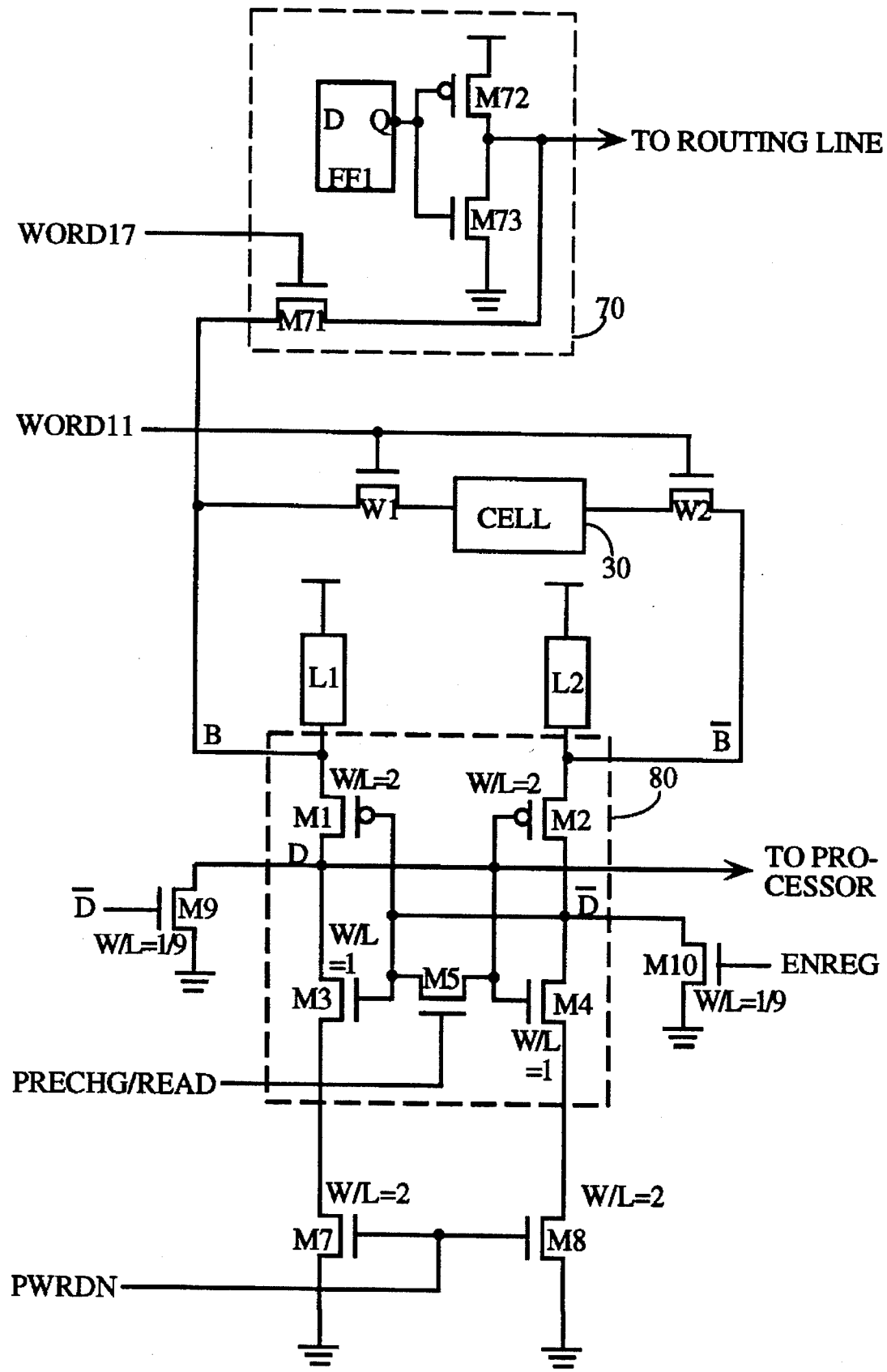
FIG. 4 shows a third embodiment of the sense amplifier of the present invention which requires no second stage.

FIG. 4 shows another embodiment of the invention which is complete in a single stage and is capable of reading a single ended register as well as a double ended memory cell. Load devices L1 and L2, which may be formed as transistors M61 and M62 of FIG. 3, or may be powered down as transistors M21 and M22 in FIG. 2, pull the bit and bitbar lines B and $\overline{B}$, to a high voltage. Power down transistors M7 and M8 perform an equivalent function to transistors M25 and M26 of FIG. 2 or transistors M65 and M66 of FIG. 3. Unlike the previous embodiments, transistors M1 through M4 can form a latch 80. The two legs of the circuit comprise matching transistors, that is, L1 matches L2, P-channel transistor M1 matches P-channel transistor M2, N-channel transistor M3 matches N-channel transistor M4, and N-channel transistor M7 matches N-channel transistor M8. Preferred width-to-length ratios are shown in FIG. 4 next to the respective transistors.

When no read is occurring, transistor M5 is held high and short circuits D and $\overline{D}$ to the same voltage. Before reading, power down line PWRDN is brought high, turning on transistors M7 and M8 so that current flows through transistors M1 through M4. Then the precharge/read line PRECHG/READ is brought low, turning off M5 so that D and $\overline{D}$ can move to different voltages. A word line such as WORD11 is brought high, turning on transistors W1 and W2 so that cell 30 can be read. Alternatively, a register read line such as WORD17 is brought high so that single ended register 70 can be read. If cell 30 or register 70 carries a logical 1 and places 5 volts onto bitline B, there will be no differential voltage between B and $\overline{B}$ to be latched as a voltage difference into latch 80.

As a novel feature of the invention, when a value is to be read, register enable line ENREG is brought high, turning on transistor M10. Transistor M10 is a weak transistor, in one embodiment having a length to width ratio of 9:1. Transistor M10 provides a weak pull down to $\overline{D}$, which causes D to latch a logical 1 if B and $\overline{B}$ are equal, but does not override D=0 if cell 30 or register 70 carried a logical 0. After latch 80 has stabilized, word line WORD11 or WORD17 or some other word line is again brought low, and the value on D is read by the processor or other device. In one embodiment, a matching transistor M9 has its gate controlled by $\overline{D}$, and pulls down D more strongly when $\overline{D}$ is higher than D, thus providing a clean logical 0 when B is lower than $\overline{B}$.

Other embodiments of the invention will become obvious to those skilled in the art in light of the above description, and such embodiments are intended to fall within the scope of the present invention. For one example, transistors M9 and M10 of FIG. 4 can be replaced by a divider (resistor or transistor) which weakly attempts to bring voltages at nodes D and $\overline{D}$ to a middle level, the divider which replaces M10 being sized to an equilibrium voltage lower than the divider which replaces M9. For another example, although several embodiments show a single ended register and a double ended configuration memory cell, it would be obvious to provide a single ended memory cell or a double ended register.

I claim:

1. A sense amplifier comprising:

means for precharging a bit line and a bitbar line near to the level of a positive voltage supply;

means for maintaining an output of a memory cell to be read through said bit and bitbar lines sufficiently close to one of said positive voltage supply and ground that a device controlled by said memory cell is not disturbed by reading said memory cell;

means for deriving a voltage difference from a difference between currents flowing in said bit and bitbar lines;

amplifier means for generating an output signal having a first value when said derived voltage difference is positive and when said derived voltage difference is zero and a second value when said derived voltage difference is negative.

2. A sense amplifier comprising:

a bit line connected to one terminal of a storage device and connected through a first load device to a positive voltage supply;

a bitbar line connected through a second load device to said positive voltage supply;

means for maintaining an output of said storage device sufficiently close to one of said positive voltage supply and ground that a device controlled by said storage device is not disturbed by reading said storage device;

a latch comprising first and second cross coupled inverters, said first inverter being powered by said first load device connected to said bit line, and said second inverter being powered by said second load device connected to said bitbar line;

means for precharging said first and second inverters to the same voltage; and means for pulling the output of said second inverter to a lower voltage than the output of said first inverter.

3. A sense amplifier as in claim 2 in which said first and second inverters are CMOS and match each other.

4. A sense amplifier as in claim 2 in which said first and second load devices match each other.

5. A sense amplifier as in claim 2 further comprising a power down device which can connect and disconnect said latch from a negative power supply voltage.

6. A sense amplifier as in claim 2 further comprising means for pulling down the output of said first inverter.

7. A sense amplifier as in claim 2 in which said bitbar line is connected to another terminal of said storage device to receive the complement of a signal on said one terminal.

8. A sense amplifier comprising:

means for maintaining a bit line and a bitbar line at voltage levels sufficient to ensure that transistors driven by a storage device to which said bit and bitbar lines may be connected remain conductive while said storage device is being read;

means for deriving an output signal from a difference in currents flowing in said bit and bitbar lines, said output signal having a first value when said current difference is positive and when said current difference is zero, and a second value when said current difference is negative.

9. A sense amplifier as in claim 8 further comprising:

means for maintaining said output signal of said storage device at the level of one of a positive voltage supply and ground.

10. A sense amplifier as in claim 8 further comprising:

means for latching said output signal.

* * * * *